(12) United States Patent
Tang et al.

(10) Patent No.: US 11,443,813 B2
(45) Date of Patent: Sep. 13, 2022

(54) METHODS FOR ERASE AND RESET IN A THREE-DIMENSIONAL NAND FLASH MEMORY

(71) Applicant: Yangtze Memory Technologies Co., Ltd., Hubei (CN)

(72) Inventors: Qiang Tang, Hubei (CN); Li Wei Wang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/159,354

(22) Filed: Jan. 27, 2021

(65) Prior Publication Data

US 2022/0180933 A1 Jun. 9, 2022

Related U.S. Application Data

(63) Continuation of application No. PCT/CN2020/133774, filed on Dec. 4, 2020.

(51) Int. Cl.
*G11C 16/04* (2006.01)
*G11C 16/16* (2006.01)
(Continued)

(52) U.S. Cl.
CPC .......... *G11C 16/16* (2013.01); *G11C 16/0483* (2013.01); *H01L 27/11529* (2013.01);
(Continued)

(58) Field of Classification Search
None
See application file for complete search history.

(56) References Cited

U.S. PATENT DOCUMENTS 5,671,176 A 9/1997 Jang et al.
5,963,476 A 10/1999 Hung et al.
(Continued)

FOREIGN PATENT DOCUMENTS

CN 110808077 A 2/2020
TW 201434047 A 9/2014

OTHER PUBLICATIONS

International Search Report of the International Searching Authority directed to related International Patent Application No. PCT/CN2020/133774, dated Sep. 9, 2021; 5 pages.
(Continued)

*Primary Examiner* — Jason Lappas
(74) *Attorney, Agent, or Firm* — Sterne, Kessler, Goldstein & Fox P.L.L.C.

(57) ABSTRACT

Methods for erasing storage data of a three-dimensional (3D) memory device are presented. The 3D memory device includes a plurality of memory blocks, each memory block having a plurality of memory strings with vertically stacked memory cells. Each memory cell is addressable through a word line and a bit line. The storage data in a selected memory block can be erased by applying an erase voltage on an array common source and applying a first voltage on the word lines of the selected memory block. Word lines of an unselected memory block are floating, i.e., without external bias, during the erasing operation. After the erasing operation, a second voltage is applied on the word lines of entire memory plane to reset the memory cells for improved data retention.

20 Claims, 8 Drawing Sheets

(51) Int. Cl.
    *H01L 27/11573*   (2017.01)
    *H01L 27/11529*   (2017.01)
    *H01L 27/11582*   (2017.01)
    *H01L 27/11556*   (2017.01)

(52) U.S. Cl.
    CPC ... *H01L 27/11556* (2013.01); *H01L 27/11573* (2013.01); *H01L 27/11582* (2013.01)

(56) References Cited

U.S. PATENT DOCUMENTS

| | | | |
|---|---|---|---|
| 6,091,632 | A | 7/2000 | Yoshimi et al. |
| 6,330,189 | B1 | 12/2001 | Sakui et al. |
| 7,551,492 | B2 | 6/2009 | Kim |
| 9,142,305 | B2 | 9/2015 | Dunga |
| 2004/0100826 | A1 | 5/2004 | Cho |
| 2006/0050594 | A1 | 3/2006 | Park |
| 2010/0117139 | A1 | 5/2010 | Lue |
| 2011/0194357 | A1 | 8/2011 | Han et al. |
| 2012/0051143 | A1 | 3/2012 | Yoon et al. |
| 2013/0294167 | A1 | 11/2013 | Li et al. |
| 2013/0336063 | A1 | 12/2013 | Kim |
| 2015/0179271 | A1 | 6/2015 | Nam et al. |
| 2017/0372789 | A1* | 12/2017 | Ray .................. G11C 16/0483 |
| 2019/0006013 | A1 | 1/2019 | Lee |

OTHER PUBLICATIONS

Chinese Application No. 202080003886.9. Office Action dated Jun. 16, 2022; 9 pages.

\* cited by examiner

METHODS FOR ERASE AND RESET IN A THREE-DIMENSIONAL NAND FLASH MEMORY

CROSS-REFERENCE TO RELATED APPLICATIONS AND INCORPORATION BY REFERENCE

This application claims priority to PCT/CN2020/133774 filed on Dec. 4, 2020, which is incorporated herein by reference in its entirety.

TECHNICAL FIELD

The present disclosure generally relates to the field of semiconductor technology, and more particularly, to methods of erasing and resetting a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. While memory cells in a memory page sharing the same word line can be programmed and read simultaneously, memory cells in an entire memory block sharing a common source line are erased at the same time. Memory cells undergoing an erase operation typically are biased with a high voltage to remove the storage data (or stored charge carriers), which can cause defects and induce mobile charges in the memory films of the memory cells. Therefore, a need exists for a method to erase and reset the memory blocks to improve data retention of the 3D NAND memory.

BRIEF SUMMARY

Embodiments of erase and reset methods for a three-dimensional (3D) memory device is described in the present disclosure.

One aspect of the present disclose provides a method for operating a three-dimensional (3D) memory device having memory blocks, wherein each memory block includes memory strings with vertically stacked memory cells, and wherein each vertically stacked memory cell is addressable through a word line and a bit line. The method includes the following steps: performing an erase operation on a selected memory block; inhibiting the erase operation on an unselected memory block; and applying a reset voltage on word lines of the unselected memory block to reset the unselected memory block after performing the erase operation.

In some embodiments, the performing the erase operation on the selected memory block includes applying an erase voltage on an array common source of the selected memory block; and applying a first voltage on word lines of the selected memory block, wherein the first voltage is less than the erase voltage to thereby erase the selected memory block.

In some embodiments, the first voltage includes a voltage in a range between about 0 V and about 1 V. In some embodiments, the first voltage includes a voltage of about 0 V.

In some embodiments, the erase voltage includes a voltage in a range between about 15 V to about 25 V.

In some embodiments, the method for operating the 3D memory device further includes resetting the selected memory block after performing the erase operation, where the resetting includes applying the reset voltage on the word lines of the selected memory block.

In some embodiments, the method for operating the 3D memory device further includes applying a voltage of about 0 V on the array common source of the selected memory block after performing the erase operation.

In some embodiments, the method for operating the 3D memory device further includes, prior to performing the erase operation, applying a voltage of about 0 V on the word lines of the selected memory block; and subsequently removing the voltage of about 0 V from the word lines of the selected memory block such that the word lines of the selected memory block are floating without an external bias.

In some embodiments, the reset voltage includes a voltage in a range between about 1.5 V to about 3.5 V.

In some embodiments, the inhibiting the erase operation on the unselected memory block includes floating the word lines of the unselected memory block without an external voltage.

In some embodiments, the inhibiting the erase operation on the unselected memory block also includes floating an array common source of the unselected memory block.

Another aspect of the present disclosure provides a three-dimensional (3D) memory device structure. The 3D memory device includes a peripheral circuit, configured to perform an erase operation on a selected memory block; inhibit the erase operation on an unselected memory block; and apply a reset voltage on word lines of the unselected memory block to reset the unselected memory block after performing the erase operation.

In some embodiments, during the erase operation, the peripheral circuit is further configured to apply an erase voltage on an array common source of the selected memory block; and apply a first voltage on word lines of the selected memory block, wherein the first voltage is less than the erase voltage to thereby erase the selected memory block.

In some embodiments, the periphery circuit is further configured to reset the selected memory block after performing the erase operation, wherein the reset voltage is applied on word lines of the selected memory block.

In some embodiments, the periphery circuit is further configured to apply a voltage of about 0 V on the word lines of the selected memory block prior to performing the erase operation; and remove the voltage of about 0 V from the word lines of the selected memory block subsequently such that the word lines of the selected memory block are floating without an external bias.

In some embodiments, during inhibiting the erase operation on the unselected memory block, the periphery circuit is further configured to float the word lines of the unselected memory block without an external voltage; and float an array common source of the unselected memory block.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
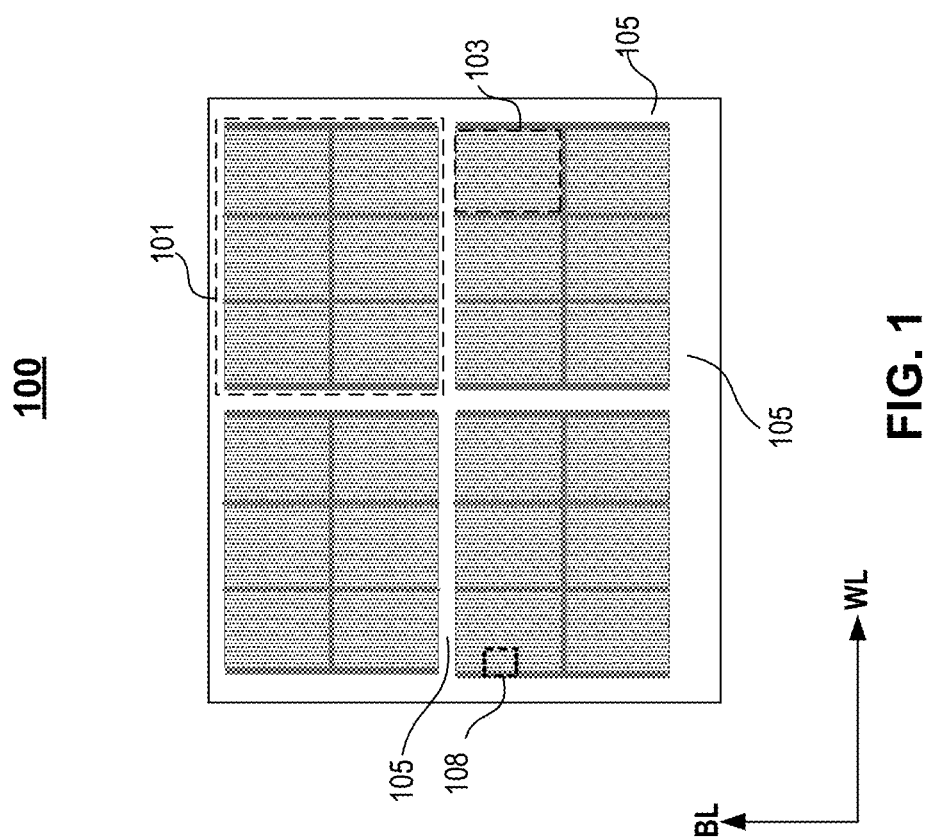
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier,"

a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
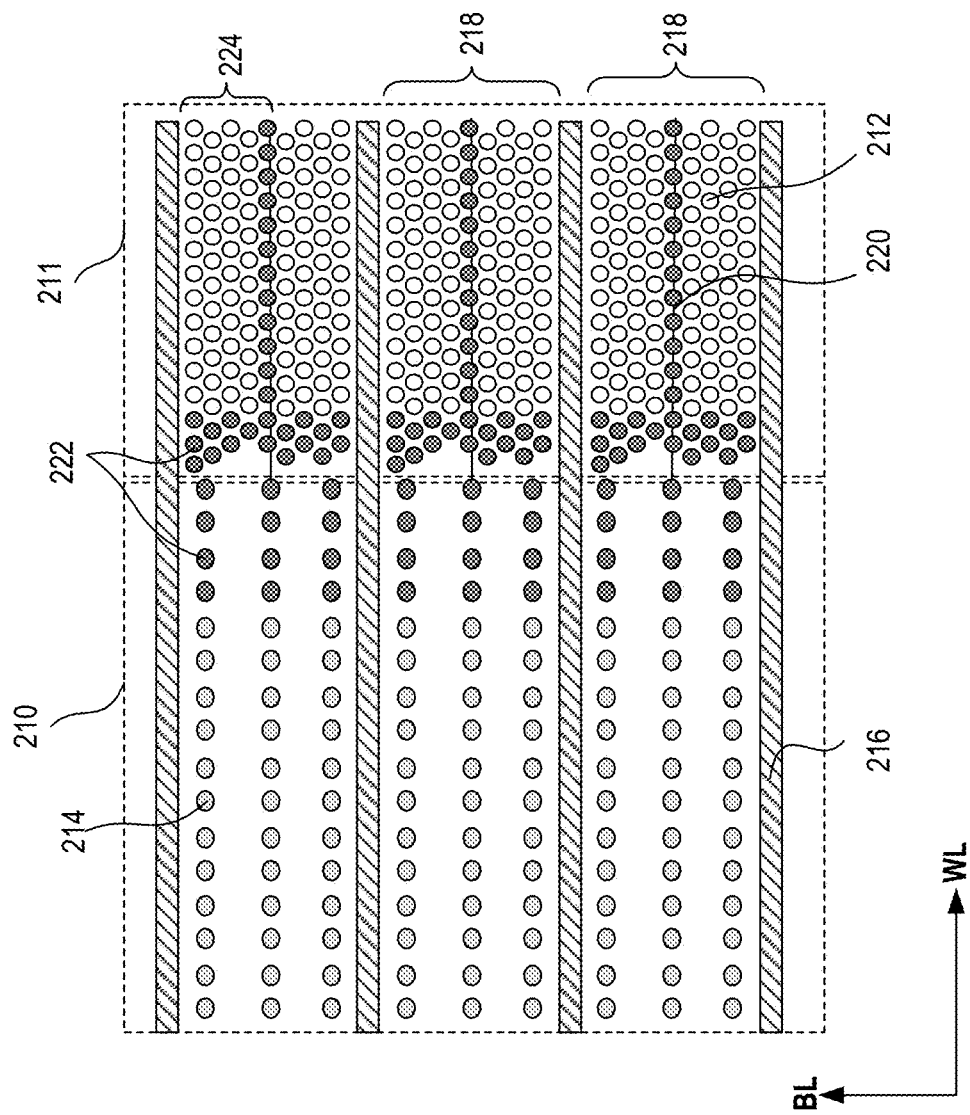
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
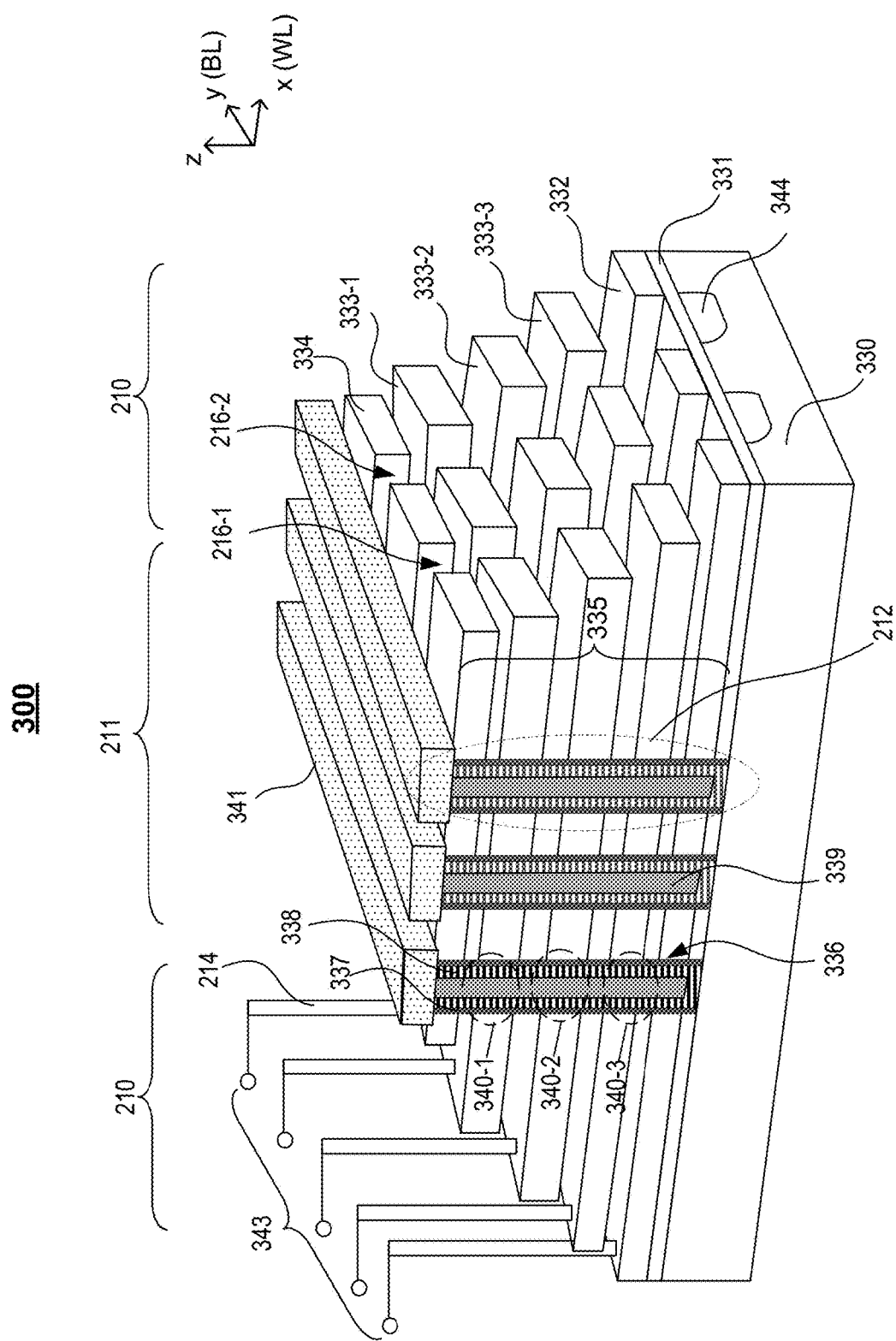
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

Figure 4:
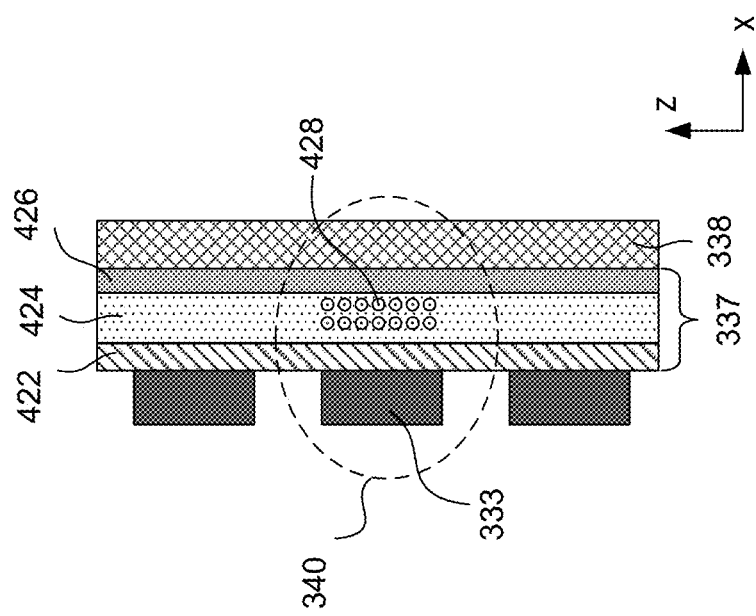
FIG. 4 illustrates a cross-sectional view of 3D memory device, according to some embodiments of the present disclosure.

FIG. 4 illustrates a schematic cross-section of a 3D NAND memory 400, which includes memory cells similar to the memory cell 340 in FIG. 3. The memory cell 340 includes a control gate (e.g., the control gate 333), a memory film (e.g., the memory film 337) and a channel layer (e.g., the channel layer 338, also referred to as the channel).

In a 3D NAND memory, the memory film 337 can be disposed on a sidewall of each channel hole 336 (illustrated in FIG. 3). In some embodiments, the memory film 337 can include a barrier layer 422, a storage layer 424, and a tunneling layer 426. The barrier layer 422 can be used to block the movement of charge carriers 428 between the control gate 333 and the storage layer 424. The barrier layer 422 can include silicon oxide and high dielectric constant (high-k) dielectrics, for example, aluminum oxide. The storage layer 424 can be used to store charge carriers 428 and can include silicon nitride. The storage and/or removal of charge carriers in the storage layer 424 can impact the on/off state and/or a conductance of the channel layer 338. The tunneling layer 426 can be used to control the tunneling of charge carriers 428 (electrons or holes) between the channel layer 338 and the storage layer 424. The tunneling layer 426 can be silicon oxide, silicon nitride, silicon oxynitride, or any combination thereof. In a 3D NAND memory, the channel layer 338 can be disposed on a sidewall of the memory film 337 in the channel hole 336 (in FIG. 3). The channel layer 338 can include amorphous silicon, polycrystalline silicon, and/or monocrystalline silicon.

Figure 5:
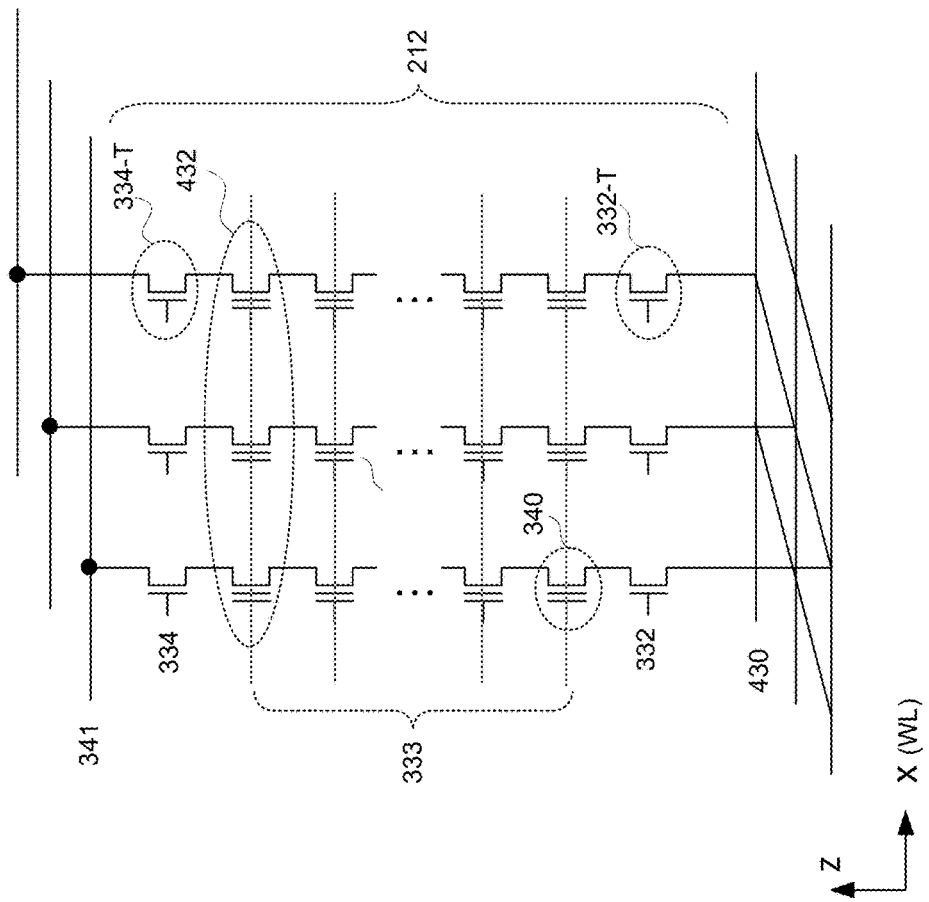
FIG. 5 illustrates a schematic circuit diagram of a 3D memory device, according to some embodiments of the present disclosure.

FIG. 5 shows a schematic circuit diagram of the memory block 103 (also referred to as memory array 103), according to some embodiments of the present disclosure. The memory array 103 includes a plurality of memory strings 212, each memory string 212 having a plurality of memory cells 340. The memory string 212 also includes at least one field effect transistor (e.g., MOSFET) at each end, which is controlled by a lower select gate (LSG) 332 and a top select gate (TSG) 334, respectively. And the two respective transistors are referred to as lower and top select transistors 332-T and 334-T. The memory cell 340 can be controlled by a control gate 333, where the control gates 333 can be connected to the word lines of the memory array 103. For simplicity, the control gates and word lines are used exchangeably in the present disclosure. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

In some embodiments, the memory array 103 can be formed based on floating gate technology. In some embodiments, the memory array 103 can be formed based on charge trapping technology. The NAND flash memory based on charge trapping can provide high storage density and high intrinsic reliability. Storage data or logic states ("state," e.g., threshold voltage $V_{th}$ of the memory cell 340) depends on the number of charge carriers trapped in a storage layer (e.g., the storage layer 424 in FIG. 4).

In a NAND flash memory, read and write operations can be performed in a memory page 432, which includes all memory cells 340 sharing the same word line. In a NAND memory, the memory cell 340 can be in an erased state ER or a programmed state P1. Initially, the memory cells 340 in the memory array 103 can be reset to the erased state ER as logic "1" by implementing a negative voltage difference between the control gates 333 and source terminals of the memory cells (e.g., the ACS 430) such that trapped charge carriers in the storage layer of the memory cells 340 can be removed. For example, the negative voltage difference can be induced by setting the control gates 333 of the memory cells 340 to ground, and applying a high positive voltage to the ACS 430. At the erased state ER ("state ER"), the threshold voltage $V_{th}$ of the memory cells 340 can be reset to the lowest value, and can be measured or sensed at the bit line 341.

During programming (i.e., writing), a programming voltage $V_{pgm}$ (e.g., a positive voltage pulse between 10 V and 20 V) can be applied on the control gate 333. As a result of application of the programming voltage, charge carriers (e.g., electrons) are injected into the storage layer of the memory cell 340, thereby increasing the threshold voltage $V_{th}$ of the memory cell 340. Thus, the memory cell 340 is programmed to the state P1.

Figure 6:
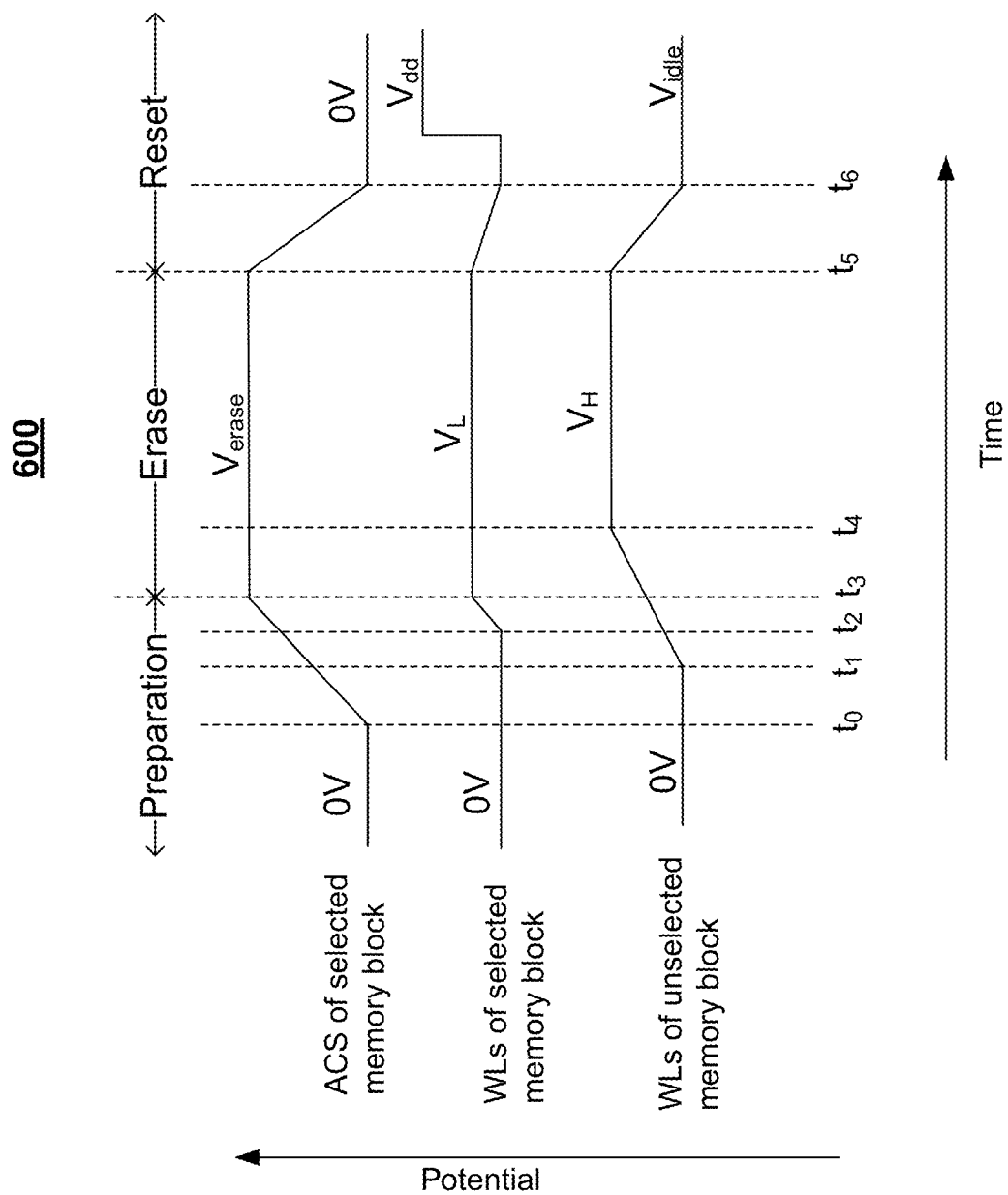
FIGS. 6-7 illustrate waveform diagrams of erase and reset operations for 3D memory devices, according to some embodiments of the present disclosure.

FIG. 6 shows waveforms for an operation 600, according to some embodiments of the present disclosure. The operation 600 comprises three phases: a preparation operation, an erase operation, and a reset operation. After performing the erase operation, charge carriers stored in the memory film of all the memory cells in a selected memory block (e.g., the memory block 103 in FIGS. 1 and 5) can be removed. As a result, the storage data in the selected memory block can be erased, and the corresponding memory cells can be reset to the erased state ER.

The operation 600 starts with the preparation operation, where an erase voltage $V_{erase}$ can be applied at the ACS of a selected memory block at to. In some embodiments, the erase voltage $V_{erase}$ can be in a range between about 15 V to about 25 V. In some embodiments, the erase voltage $V_{erase}$ can be about 20 V.

After applying the erase voltage $V_{erase}$ on the ACS, the electric potential of the channel of the memory cells in the selected memory block can increase accordingly. Charge carriers in the doped source line region 344 (see FIG. 3) can be injected into the channel layer 338. Because the mobility of charge carriers can be low in the channel layer made of polycrystalline silicon or amorphous silicon, the electric potential of the channel of the memory cells rises gradually from the bottom to the top of the channel. Accordingly, the electric potential of the channel layer in the memory string 212 rises from bottom (i.e., the ACS 430 in FIG. 5) to the top (e.g., close to the bit line 341) gradually.

In some embodiments, a hold-release pulse $V_{hld\text{-}re}$ can be applied to the word lines of the selected memory block and unselected memory blocks. The hold-release pulse $V_{hld\text{-}re}$ comprises an external bias of 0 V at $t_0$, followed by releasing the external bias at $t_1$, i.e., leaving the word lines floating after $t_1$. When an electrode is floating, electric potential (also referred to as potential) of the electrode can be changed by electromagnetic fields or charge accumulation.

Subsequently, a voltage $V_L$ can be applied to the word lines of the selected memory block at $t_2$ ($t_2 > t_1 > t_0$), where potential of the word lines of the selected memory block can reach the voltage $V_L$ at $t_3$. In some embodiments, the voltage $V_L$ can be any voltage less than about 1 V. In some embodiments, the voltage $V_L$ can be 0 V.

In some embodiments, after $t_3$, a voltage difference between the word lines and the channel layers in the selected memory block can be set as $V_L - V_{erase}$, which can be high enough to remove the stored charge carriers in the memory cells and reset the memory cells to the erased state ER. At this stage, the operation 600 enters the erase operation (i.e., the erase operation).

In some embodiments, during the erase operation, the bit lines 341 and the top select gates (TSGs) 334 of the selected memory block can be floating, i.e., not applied with any voltage. In this example, the bit line 341 and the top select transistor 334-T can be coupled to a high electric potential due to parasitic capacitances between the bit line 341 and the ACS 430.

In some embodiments, the word lines of unselected memory blocks can be kept floating after $t_1$, where potential of the word lines of unselected memory blocks can rise to a voltage $V_H$ at $t_4$ through capacitive coupling. In some embodiments, the voltage $V_H$ can have a magnitude close to the erase voltage $V_{erase}$. In some embodiments, the ACS of the unselected memory blocks can also be kept floating after $t_1$ and can also rise to the voltage $V_H$ through capacitive coupling. As such, during the erase operation, a voltage difference between the word lines and the ACS (or the channel layers) in the unselected memory blocks has a magnitude much smaller than the erase voltage $V_{erase}$. The charge carriers stored in the memory cells in the unselected memory blocks are thereby not disturbed, i.e., the unselected memory blocks are inhibited from being erased.

In some embodiments, there is a time delay before the word lines of unselected memory blocks reach the voltage $V_H$, i.e., $t_4 > t_3$. However, the voltage ramping up rate shown in FIG. 6 is for illustration only. In some embodiments, the voltage $V_L$ can be applied to the word lines of the selected memory block after $t_4$, i.e., $t_3 > t_2 > t_4$.

After the erase operation is completed, the ACS of the selected memory block and unselected memory blocks can be grounded, i.e., can be applied with a voltage of 0 V at $t_5$, when the reset operation of the operation 600 starts.

During the reset operation, the word lines of the selected memory block can be applied with a reset voltage $V_{dd}$. In some embodiments, the reset voltage $V_{dd}$ can be a voltage in a range between about 1.5 V to about 3.5 V. In some embodiments, the reset voltage $V_{dd}$ can be about 2.5 V.

For a NAND flash memory, an important reliability challenge involves the large number of program and erase operations that such memories undergo. During program and erase operations, defects can be generated in the tunneling layer (e.g., the tunneling layer 426 in FIG. 4) due to electrical stress, which can lead to a reduced lifetime of the memory cells. Through trap-assisted tunneling, these defects can act as recombining centers for the stored charge carriers at subsequent programming operations. As these defects are accumulated in the tunneling layer, data retention as a result of charge loss can lead to significant increases in bit error rate. In some embodiments, the stored charge carriers are electrons and the defects are holes. By applying a reset voltage $V_{dd}$ on the word lines at the reset operation, the holes trapped in the tunneling layer caused by program/erase cycling can be substantially removed, and thereby bit error rate can be reduced and data retention of the NAND memory can be improved.

In the operation 600 in FIG. 6, the word lines of unselected memory blocks also remain floating in the reset operation. Because the ACS is grounded, the potential of the word lines of unselected memory blocks decreases to a voltage $V_{idle}$ through capacitive coupling. In some embodiments, the voltage $V_{idle}$ has a magnitude much smaller than the reset voltage $V_{dd}$. In some embodiments, the voltage $V_{idle}$ is about 0 V.

When the memory cells in the unselected memory blocks are inhibited from erase during the operation 600, the electric potential of the floating word lines of the unselected memory blocks can change, depending on the effect of capacitive coupling. When the floating word lines of the unselected memory blocks are coupled to the voltage $V_H$ at the erase operation, the electric field induced by the voltage $V_H$ may result in increased leakage current in the surrounding area of the memory cells or in the electrically connected circuits (e.g., the drive circuits for the word lines in the peripherals). In some embodiments, mobile charges (e.g., holes) can be generated in the memory films (e.g., the memory film 337 in FIG. 4). Therefore, a need exists for a method to erase and reset a 3D NAND memory so that defects generated in the program/erase cycling can be removed and mobile charges can be stabilized.

Figure 7:
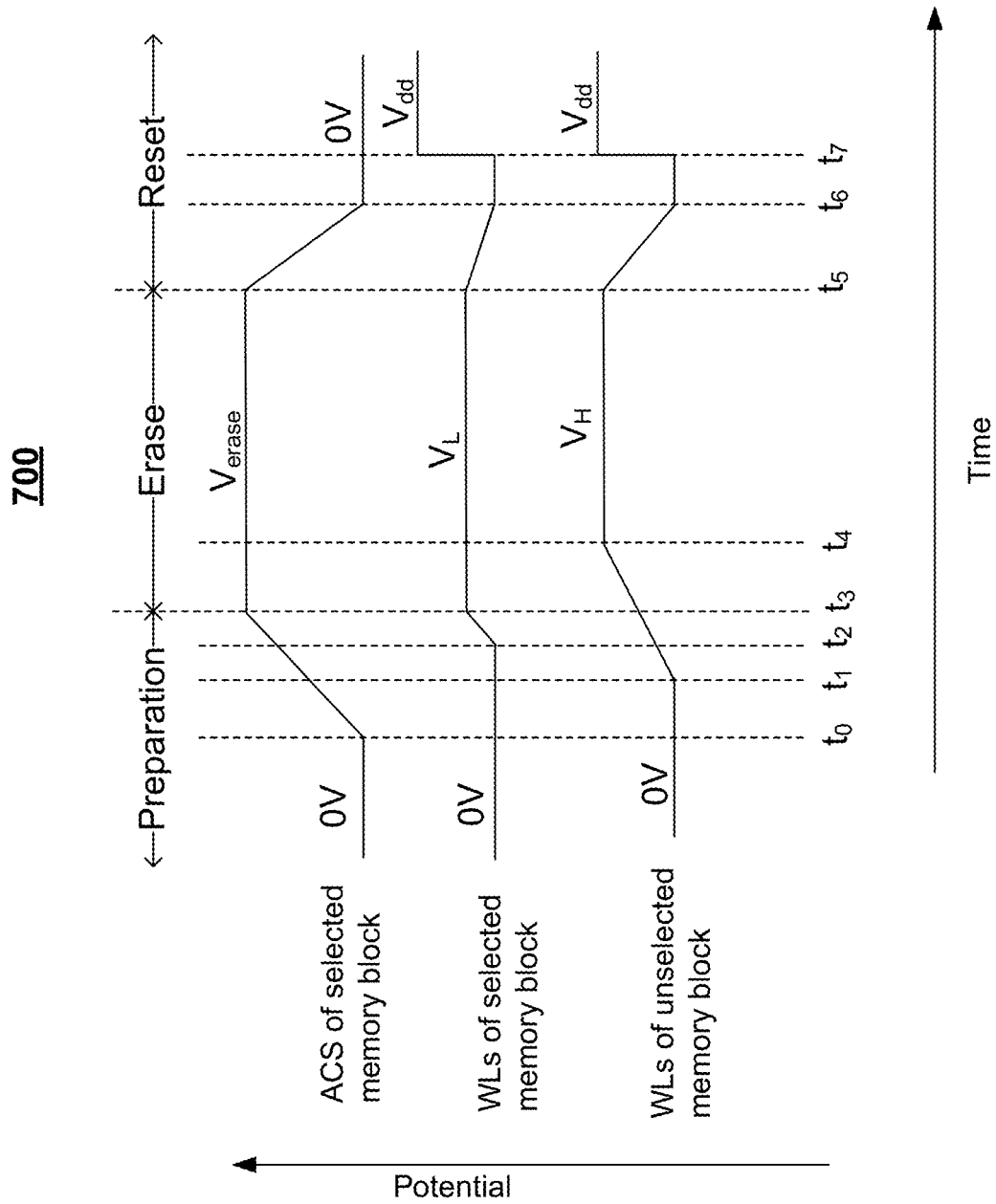

FIG. 7 shows waveforms for an operation 700, according to some embodiments of the present disclosure. The operation 700 comprises a preparation operation, an erase operation, and a reset operation, similar to those in the operation 600 in FIG. 6. However, unlike the operation 600, the reset voltage $V_{dd}$ can be applied to the word lines of unselected memory blocks during the reset operation of the operation 700. In the other words, during the reset operation, the word lines of the entire memory plane (e.g., the memory plane 101 in FIG. 1) can be applied with the reset voltage $V_{dd}$. In some embodiments, the reset voltage $V_{dd}$ can be a constant voltage that can be applied at $t_7$ where $t_7 > t_6$ and can be turned off until the end of the operation 700, as shown in FIG. 7. In some embodiments, the rest voltage $V_{dd}$ can be a voltage pulse with a duration in a range between about 10 ns to about 100 μs.

In some embodiments, the reset voltage $V_{dd}$ can be applied to the word lines of the selected and unselected memory blocks (or the entire memory plane) at any other time during the reset operation. For example, the reset voltage $V_{dd}$ can be applied to the word lines of the memory plane at $t_5$ when the erase operation ends, i.e., when the erase voltage $V_{erase}$ is removed from the ACS of the selected memory block and/or when the ACS of the selected memory block is grounded. The reset voltage $V_{dd}$ can also be applied to the word lines of the memory plane at $t_6$ or any time between $t_5$ and $t_6$ where the potential of the word lines in the unselected memory blocks are ramping down from the voltage $V_H$.

In some embodiments, the reset voltage $V_{dd}$ can be applied to the word lines of any memory cells in the NAND memory when the memory cells are idle, i.e., not performing an erase, program, or read operation.

By applying the reset voltage $V_{dd}$ on the word lines of the unselected memory blocks during the reset operation, mobile charges generated in the memory films at the erase operation can be removed or stabilized. In addition, defects generated in the memory films caused by previous program/erase cycling can be further reduced. Accordingly, retention of the NAND memory can be improved.

As the reset voltage $V_{dd}$ is also applied on the word lines of the selected memory block, the word lines of the entire memory plane during the reset operation of an erase operation can be applied with the reset voltage $V_{dd}$ to improve the retention of the 3D NAND memory.

Figure 8:
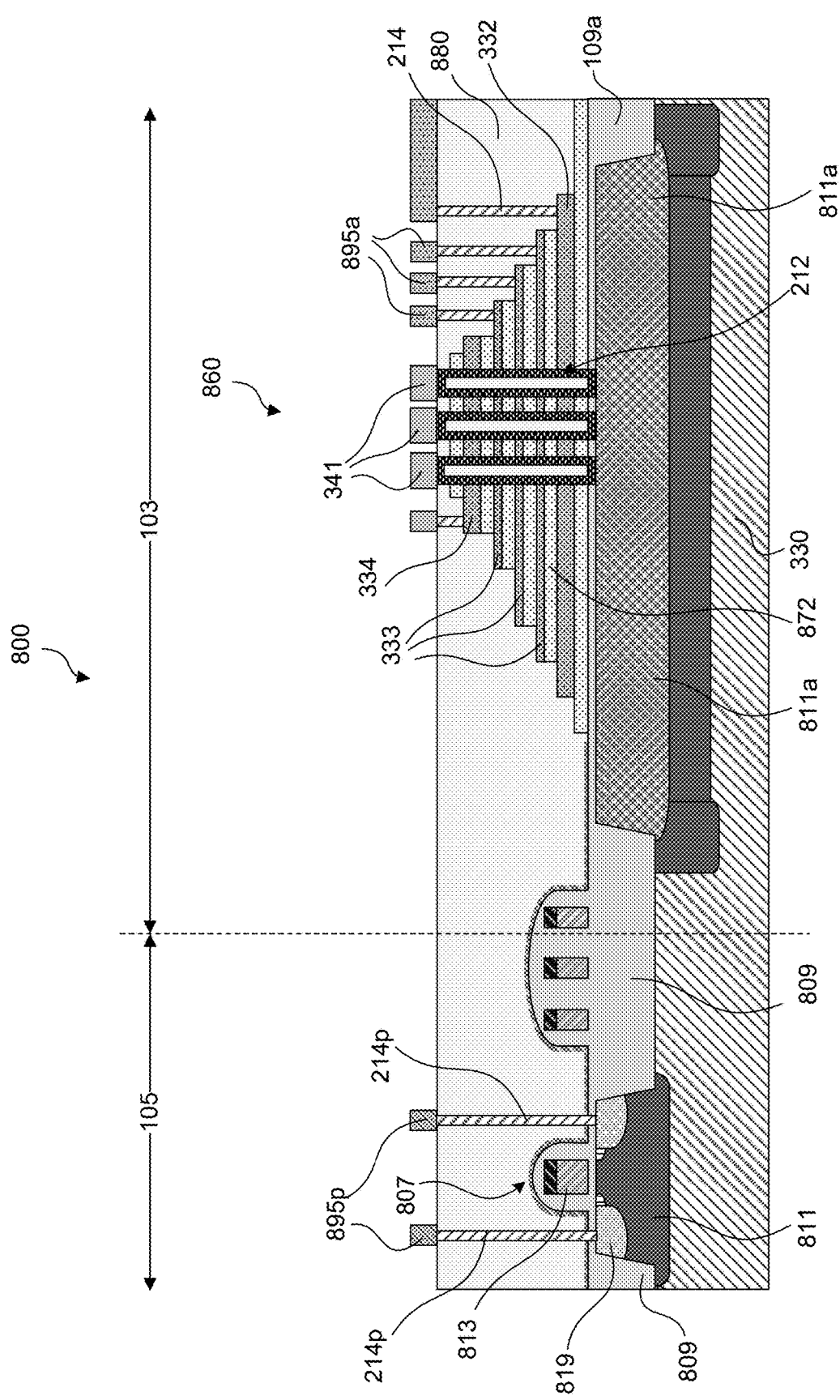
FIG. 8 illustrates a cross-sectional view of an exemplary semiconductor memory device, according to some embodiments of the present disclosure.

FIG. 8 illustrates a cross-sectional view of an exemplary semiconductor memory device 800. A semiconductor memory device 800 includes the substrate 330 having the periphery region 105 with peripheral devices such as a peripheral MOSFET 807, the memory block second region 103 with one or more memory arrays such as a 3D array structure 860.

In some embodiments, the 3D array structure 860 is similar to the memory array structure 300, which includes an array well 811a, the lower select gates 332, and the control gates (or word-lines) 333 and the top select gates 334. Between adjacent lower select gates 332, control gates 333 and top select gates 334 are dielectric layers 872. The memory device further includes memory strings 212 through top select gates 334, control gates 333, and lower select gates 332. The 3D array structure 860 further includes an insulating material 880, a plurality of bit lines 341 connected to memory strings 874 over the top select gates 334 and a plurality of metal interconnects 895a connected to the lower select gates, control gates and the top select gates through a plurality of contact structures 214.

During the fabrication of contact structures 214 and metal interconnects 895a for the 3D array structure 860, contact structures 214p and metal interconnects 895p for the peripheral devices can be formed simultaneously.

The semiconductor memory device 800 also includes peripheral circuits in the periphery region 105, which provides supporting functions to the memory block. The peripheral circuits in the periphery region 105 includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

In some embodiments, the semiconductor memory device 800 includes a peripheral circuit configured to perform the erase operation, similar to the erase operations described in FIGS. 6 and 7, on a selected memory block; inhibit the erase operation on an unselected memory block; and applying a reset voltage on word lines of the unselected memory block to reset the unselected memory block after performing the erase operation. The reset operations performed by the peripheral circuits on the selected and unselected memory blocks after the erase operations have been discussed in details with respect to FIGS. 6 and 7.

In some embodiments, the periphery region 105 can include any suitable semiconductor devices, for example, metal oxide semiconductor field effect transistors (MOSFETs), diodes, resistors, capacitor, etc. The semiconductor devices in the periphery region 105 can be used in the design of digital, analog and/or mixed signal circuits supporting the storage function of memory core, for example, row and column decoders, drivers, page buffers, sense amplifiers, timing and controls. Among the semiconductor devices, p-type and/or n-type MOSFETs are widely implemented in peripheral circuit design, and are used as examples in the description of the present disclosure. The peripheral devices, however, are not limited to MOSFETs. The structures of the other peripheral devices, for example diodes, resistors, capacitors, inductors, etc., can be formed simultaneously during MOSFETs fabrication through different mask design and layout. To form peripheral devices other than MOSFETs, process steps can be added or modified in a MOSFET's process flow, for example, processes to obtain different dopant profiles, film thicknesses or material stacks, etc. In some embodiments, peripheral devices other than MOSFETs can also be fabricated with additional design and/or lithography mask levels to achieve specific circuit requirements.

The peripheral MOSFET 807 can be either a p-channel MOSFET or an n-channel MOSFET and can include, but not limited to, an active device region surrounded by shallow trench isolation (STI) 809 (also called isolation structure(s)), a well 811 formed in the active device region with n-type or p-type doping, a gate stack 813 that includes a gate dielectric, a gate conductor and/or a gate hard mask. The peripheral MOSFET 807 can also include a source/drain extension and/or halo region, a gate spacer, and a source/drain 819 locating on each side of the gate stack. The peripheral MOSFET 807 can further include a silicide contact area (not shown) in the top portion of the source/drain. Other known devices can be also formed in the peripheral region. The structure and fabrication methods of peripheral devices, for example, p-type and/or n-type MOSFETs, are known to those skilled in the art.

The STI 809 can be formed through patterning the substrate using lithography and etching, filling an insulating material and polishing the insulating material to form a coplanar surface on the substrate 330. An insulating material for STI 809 can include silicon oxide, silicon oxynitride, TEOS, low-temperature oxide (LTO), high temperature oxide (HTO), silicon nitride, etc. An insulating material for STI 809 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, CVD using a furnace system, any other suitable deposition method, and/or combinations thereof. The forming of STI 809 can also include a high temperature annealing step to densify the disposed insulating material for better electrical isolation. Other STI structures can be employed, as would be apparent to a person of ordinary skill in the art.

The peripheral MOSFET 807 is surrounded by STI 809. The depth of STI and/or the depth of the well 811 determines the vertical dimension of the active device region of the peripheral MOSFET 807. The active device region of the peripheral MOSFET 807 can have a thickness of more than about 200 nm on the substrate 330. In some embodiments, the active device region of the peripheral MOSFET 807 can have a thickness of less than about 200 nm on substrate 330. For example, the active device region of the peripheral MOSFET can be the thickness of the top semiconductor thickness on an SOI substrate, and can be less than about 50 nm, where the underlying buried oxide serves as additional device isolation.

The well 811 of the peripheral MOSFET 807 can include a p-type doping for n-channel MOSFET and an n-type doping for p-channel MOSFET, and is called p-well and n-well, respectively. The dopant profile and concentration of the well 811 affects the device characteristics of the peripheral MOSFET 807. For MOSFET devices with low threshold voltage ($V_t$), the well 811 can be doped with lower concentration, and can form low-voltage p-well or low-voltage n-well. For MOSFET with high $V_t$, the well 811 can be doped with higher concentration, and can form high-voltage p-well or high-voltage n-well. In some embodiments, to provide electrical isolation from p-type substrate 330, a deep n-well can be formed underneath a high-voltage p-well for an n-channel MOSFET with high $V_t$.

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

The gate stack 813 of the peripheral MOSFET 807 can be formed by a "gate first" scheme, where the gate stack 813 is disposed and patterned prior to source/drain formation. The gate stack 813 of the peripheral MOSFET 807 can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, CVD using a furnace system, any other suitable deposition method, and/or combinations thereof.

In some embodiments, the gate conductor can be made from a metal, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, the source/drain 819 of the peripheral MOSFET 807 is incorporated with high concentration dopants. For n-type MOSFETs, the dopant for source/drain 819 can include any suitable n-type dopant, such as phosphorus, arsenic, antimony, etc., and/or any combination thereof. For p-type MOSFETs, the dopant for source/drain 819 can include any suitable p-type dopant, for example boron. The dopant incorporation can be achieved through ion implantation followed by dopant activation anneal. The source/drain 819 of a peripheral MOSFET can be made of the same material as the substrate 330, for example, silicon. In some embodiments, the source/drain 819 of a peripheral MOSFET 807 can be made of a different material from the substrate 330 to achieve high performance. For example, on a silicon substrate, the source/drain 819 for a p-type MOSFETs can include SiGe and the source/drain 819 for an n-type MOSFETs can include carbon incorporation. The forming of the source/drain 819 with a different material can include etching back the substrate material in the source/drain area and disposing new source/drain material using techniques such as epitaxy. Doping for source/drain 819 can also be achieved through in-situ doping during epitaxy.

Because 3D memory devices operate under low signal-to-noise conditions, semiconductor devices in the periphery are required to have reliable performance and low leakage current. For example, in a sense amplifier, a peripheral transistor needs to have excellent threshold voltage ($V_t$) matching. In a row or column decoder, a transistor needs to provide higher bias to drive the memory elements. To achieve fast read and write from/to the memory array, periphery devices also need to have high performance (e.g., high drive current) with good short channel control.

To satisfy the requirements of different functions of peripheral circuits, MOSFETs with different structures and characteristics can be fabricated. For example, MOSFET with thicker gate dielectric layers (such as $SiO_2$ and/or $HfO_2$) can be implemented for applications with high voltage bias. In another example, gate stack can include a single work function metal and dual high-k dielectric material to make MOSFETs with different $V_t$.

The peripheral MOSFET 807 can be formed on the substrate 330 with a planar active device region (as shown in FIG. 8), where the direction of MOSFET's channel and current flow is parallel to the top surface of the substrate 330. In some embodiments, the peripheral MOSFET 807 can also be formed on the substrate 330 with a 3D active device region, for example a so-called "FINFET" in a shape like a "FIN" (not shown), where the gate stack of the MOSFET is wrapped around the FIN, and the MOSFET's channel lies along three sides of the FIN (top and two sidewalls under the gate). The structure and methods for FINFET device are known to those skilled in the art and are not discussed further in present disclosure.

The structures and fabrication processes for the peripheral devices are not limited to the structures and processes described above. Other processing steps can be performed as well before, after, or between any of the said processes. The sequence of the said processes can also be in a different order and process steps can be omitted and in a combination of any form, as would be apparent to a person of ordinary skill in the art.

In summary, the present disclosure provides a method for operating a three-dimensional (3D) memory device having memory blocks, wherein each memory block includes memory strings with vertically stacked memory cells, and wherein each vertically stacked memory cell is addressable through a word line and a bit line. The method includes the following steps: performing an erase operation on a selected memory block; inhibiting the erase operation on an unselected memory block; and applying a reset voltage on word lines of the unselected memory block to reset the unselected memory block after performing the erase operation.

The present disclosure also provides a three-dimensional (3D) memory device structure. The 3D memory device includes a peripheral circuit, configured to perform an erase operation on a selected memory block; inhibit the erase operation on an unselected memory block; and apply a reset voltage on word lines of the unselected memory block to reset the unselected memory block after performing the erase operation.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for operating a three-dimensional (3D) memory device comprising memory blocks, wherein each memory block comprises memory strings with vertically stacked memory cells, and wherein each vertically stacked memory cell is addressable through a word line and a bit line, the method comprising:
   performing an erase operation on a selected memory block;
   inhibiting the erase operation on an unselected memory block; and
   applying a reset voltage on word lines of the unselected memory block to reset the unselected memory block after performing the erase operation.

2. The method of claim 1, wherein the performing the erase operation on the selected memory block comprises:
   applying an erase voltage on an array common source of the selected memory block; and
   applying a first voltage on word lines of the selected memory block, wherein the first voltage is less than the erase voltage to thereby erase the selected memory block.

3. The method of claim 2, wherein the applying the first voltage comprises applying a voltage in a range between about 0 V and about 1 V.

4. The method of claim 2, wherein the applying the first voltage comprises applying a voltage of about 0 V.

5. The method of claim 2, wherein the applying the erase voltage comprises applying a voltage in a range between about 15 V to about 25 V.

6. The method of claim 2, further comprising:
   resetting the selected memory block after performing the erase operation, the resetting comprising applying the reset voltage on the word lines of the selected memory block.

7. The method of claim 6, further comprising:
   applying a voltage of about 0 V on the array common source of the selected memory block after performing the erase operation.

8. The method of claim 2, further comprising:
   prior to performing the erase operation, applying a voltage of about 0 V on the word lines of the selected memory block; and
   subsequently removing the voltage of about 0 V from the word lines of the selected memory block such that the word lines of the selected memory block are floating without an external bias.

9. The method of claim 1, wherein applying the reset voltage comprises applying a voltage in a range between about 1.5 V to about 3.5 V.

10. The method of claim 1, wherein the inhibiting the erase operation on the unselected memory block comprises floating the word lines of the unselected memory block without an external voltage.

11. The method of claim 1, wherein the inhibiting the erase operation on the unselected memory block further comprises floating an array common source of the unselected memory block.

12. A three-dimensional (3D) memory device, comprising:
   a memory block, comprising memory cells, wherein each of the memory cells is addressable through a word line and a bit line; and
   a peripheral circuit, configured to:
      perform an erase operation on a selected memory block;
      inhibit the erase operation on an unselected memory block; and
      apply a reset voltage on word lines of the unselected memory block to reset the unselected memory block after performing the erase operation.

13. The 3D memory device of claim 12, wherein during the erase operation, the peripheral circuit is further configured to:
   apply an erase voltage on an array common source of the selected memory block; and
   apply a first voltage on word lines of the selected memory block, wherein the first voltage is less than the erase voltage to thereby erase the selected memory block.

14. The 3D memory device of claim 13, wherein the first voltage comprises a voltage in a range between about 0 V and about 1 V.

15. The 3D memory device of claim 13, wherein the first voltage is a voltage of about 0 V.

16. The 3D memory device of claim 13, wherein the erase voltage comprises a voltage in a range between about 15 V to about 25 V.

17. The 3D memory device of claim 12, wherein the periphery circuit is further configured to:
   reset the selected memory block after performing the erase operation, wherein the reset voltage is applied on word lines of the selected memory block.

18. The 3D memory device of claim 17, wherein the reset voltage comprises a voltage in a range between about 1.5 V to about 3.5 V.

19. The 3D memory device of claim 17, wherein the periphery circuit is further configured to:
   apply a voltage of about 0 V on the word lines of the selected memory block prior to performing the erase operation; and remove the voltage of about 0 V from the word lines of the selected memory block subsequently such that the word lines of the selected memory block are floating without an external bias.

20. The 3D memory device of claim 19, wherein during inhibiting the erase operation on the unselected memory block, the periphery circuit is further configured to:
   float the word lines of the unselected memory block without an external voltage; and
   float an array common source of the unselected memory block.

* * * * *